(12) United States Patent
Zhao

(10) Patent No.: US 10,288,928 B2
(45) Date of Patent: May 14, 2019

(54) PHOTOMASK AND METHOD OF MANUFACTURING COLOR FILTER SUBSTRATE

(71) Applicant: Shenzhen China Star Optoelectronics Technology Co., Ltd., Shenzhen (CN)

(72) Inventor: Chuang Zhao, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 14/897,705

(22) PCT Filed: Oct. 14, 2015

(86) PCT No.: PCT/CN2015/091891
§ 371 (c)(1),
(2) Date: Oct. 30, 2017

(87) PCT Pub. No.: WO2017/004905
PCT Pub. Date: Jan. 12, 2017

(65) Prior Publication Data
US 2018/0088406 A1    Mar. 29, 2018

(30) Foreign Application Priority Data
Jul. 7, 2015    (CN) .......................... 2015 1 0393712

(51) Int. Cl.
*G02B 5/20* (2006.01)
*G02F 1/1335* (2006.01)
(Continued)

(52) U.S. Cl.
CPC ....... *G02F 1/133516* (2013.01); *G02B 5/223* (2013.01); *G02F 1/1339* (2013.01);
(Continued)

(58) Field of Classification Search
CPC ...... G03F 1/50; G03F 7/70283; G03F 7/2024; G03F 7/0007; G02B 5/223; G02F 1/13394; G02F 1/13396; G02F 2001/13396
(Continued)

(56) References Cited

U.S. PATENT DOCUMENTS 6,597,425 B2 * 7/2003 Kadota ............... G02F 1/13394
349/156
2006/0033876 A1  2/2006 Park et al.
(Continued)

FOREIGN PATENT DOCUMENTS

CN         1726427 A       1/2006
CN       102213857 A      10/2011
(Continued)

OTHER PUBLICATIONS

Computer-generated translation of JP 2009-151150 (dated Jul. 2009). (Year: 2009).*
(Continued)

*Primary Examiner* — John A McPherson
(74) *Attorney, Agent, or Firm* — Andrew C. Cheng

(57) ABSTRACT

Provided are a photomask and a method of manufacturing a color filter substrate. This belongs to the field of display technologies, and can be used to simplify manufacturing process of the color filter substrate and improve manufacturing efficiency of the color filter substrate.

5 Claims, 2 Drawing Sheets

(51) Int. Cl.
 *G02F 1/1339* (2006.01)
 *G03F 1/00* (2012.01)
 *G03F 7/00* (2006.01)
 *G02B 5/22* (2006.01)
 *G03F 7/20* (2006.01)
 *G03F 1/50* (2012.01)

(52) U.S. Cl.
 CPC .............. *G03F 1/00* (2013.01); *G03F 1/50* (2013.01); *G03F 7/0007* (2013.01); *G03F 7/2024* (2013.01)

(58) Field of Classification Search
 USPC .......................... 430/5, 7, 321; 349/106, 156
 See application file for complete search history.

(56) References Cited

U.S. PATENT DOCUMENTS

| 2006/0147682 | A1 | 7/2006 | Takahashi | |
| 2012/0057111 | A1* | 3/2012 | Ohkubo | G02F 1/1339 349/106 |
| 2014/0063421 | A1* | 3/2014 | You | G02F 1/1335 349/106 |
| 2015/0370163 | A1 | 12/2015 | Wu et al. | |
| 2016/0004113 | A1 | 1/2016 | Guo et al. | |
| 2016/0291221 | A1 | 10/2016 | Meng | |

FOREIGN PATENT DOCUMENTS

| CN | 103353693 A | * | 10/2013 |
| CN | 103529591 A | | 1/2014 |
| CN | 104155843 A | | 11/2014 |
| CN | 104698739 A | | 6/2015 |
| CN | 104932138 A | | 9/2015 |
| EP | 1 666 957 A1 | | 6/2006 |
| JP | 2009-151150 A | * | 7/2009 |

OTHER PUBLICATIONS

Computer-generated translation of CN 103353693 (dated Oct. 2013). (Year: 2013).*
Office Action dated May 19, 2017, by the State Intellectual Property Office of People's Republic of China in corresponding Chinese Patent Application No. 201510393712.9. (6 pages).
Notification of Transmittal of the International Search Report and the Written Opinion of the International Searching Authority (Forms PCT/ISA/210, PCT/ISA/210, and PCT/ISA/237) dated Mar. 24, 2016, by the State Intellectual Property Office of People's Republic of China Patent Office in corresponding International Application No. PCT/CN2015/091691. (14 pages).

* cited by examiner

PHOTOMASK AND METHOD OF MANUFACTURING COLOR FILTER SUBSTRATE

CROSS-REFERENCE TO RELATED APPLICATIONS

The present application claims the priority of Chinese patent application CN 201510393712.9, entitled "Photomask and method of manufacturing color filter substrate" and filed on Jul. 7, 2015, the entirety of which is incorporated herein by reference.

FIELD OF THE INVENTION

The present disclosure relates to the field of display technologies, and in particular, to a photomask and a method of manufacturing a color filter substrate.

BACKGROUND OF THE INVENTION

Among flat panel display devices, thin film transistor-liquid crystal display (TFT-LCD for short) devices with the features such as small sizes, low power consumption, relatively low manufacturing costs, and low radiation, hold a dominating position in the current market of flat panel display devices.

A TFT-LCD device substantially comprises an array substrate having TFTs arranged in an array, a color filter substrate aligned and assembled with the array substrate, and liquid crystal molecules packaged between the array substrate and the color filter substrate. In the current TFT-LCD industry, the color filter substrate can be manufactured substantially in the following steps: first forming a black matrix through one patterning procedure; forming a red color barrier, a green color barrier, and a blue color barrier on the black matrix respectively through three patterning procedures; then forming a flat panel electrode as a common electrode; and finally forming a spacer on the common electrode through one or two patterning procedures. The existing manufacturing process of the TFT-LCD color filter substrate are obviously complicated, thereby reducing the manufacturing efficiency of the TFT-LCD devices.

In connection with an In-Plane Switching (IPS for short) LCD device, the flat panel electrode will be unnecessary to be formed on the color filter substrate, and can be replaced with a flat layer. However, this does not make a difference in the present situation of relatively complicated manufacturing process of the color filter substrate.

SUMMARY OF THE INVENTION

The present disclosure aims to provide a photomask and a method of manufacturing a color filter substrate, thereby simplifying manufacturing process of the color filter substrate, and improving production efficiency of the color filter substrate.

According to a first aspect of the present disclosure, a photomask is provided, comprising a first portion with a first transmittance, a second portion with a second transmittance, and a third portion with a third transmittance, wherein the first portion, the second portion, and the third portion correspond to a flat layer of a color filter substrate, an auxiliary spacer of the color filter substrate, and a main spacer of the color filter substrate, respectively.

The first transmittance is larger than the second transmittance, and the second transmittance is larger than the third transmittance.

The present disclosure can bring about the following beneficial effects. The flat layer, the auxiliary spacer, and the main spacer of the color filter substrate can be formed simply with the photomask provided in the embodiment of the present disclosure, thereby greatly simplifying manufacturing process of the color filter substrate, and reducing manufacturing costs of the color filter substrate.

According to a second aspect of the present disclosure, a method of manufacturing a color filter substrate is provided, comprising the steps of:
   forming an insulation layer; and
   performing a patterning procedure on the insulation layer with a photomask, so as to form a flat layer, an auxiliary spacer, and a main spacer, wherein the photomask comprises a first portion with a first transmittance, a second portion with a second transmittance, and a third portion with a third transmittance, and
   wherein the first portion, the second portion, and the third portion correspond to a flat layer of the color filter substrate, an auxiliary spacer of the color filter substrate, and a main spacer of the color filter substrate, respectively.

In the above method, the first transmittance is larger than the second transmittance, and the second transmittance is larger than the third transmittance.

In the above method, the flat layer has a thickness in the range from 1 to 5 µm, and the main spacer has a height in the range from 1 to 4 µm.

In the above method, the auxiliary spacer has a height smaller than the height of the main spacer.

In the above method, the insulation layer is made of one or more materials selected from the group consisting of nitrogen oxides, silicon oxides, and nitrogen silicides.

In the above method, the insulation layer is made of photoresist.

In the above method, the step of performing a patterning procedure on the insulation layer with a photomask, so as to form a flat layer, an auxiliary spacer, and a main spacer includes the sub-steps of:
   forming a photoresist layer on the insulation layer;
   exposing the photoresist layer through the photomask;
   developing the exposed photoresist layer, such that portions of the photoresist layer corresponding to the first portion, the second portion, and the third portion of the photomask are completely removed, partially removed, and completely retained, respectively;
   etching the insulation layer for a first time, so as to form the flat layer;
   exposing and developing the photoresist layer for a second time, such that the portion of the photoresist layer corresponding to the second portion and the third portion of the photomask are completely and partially removed, respectively;
   etching the insulation layer for a second time, so as to form the auxiliary spacer; and
   removing the portion of the photoresist layer corresponding to the third portion completely, so as to form the main spacer.

In the above method, the step of performing a patterning procedure on the insulation layer with a photomask, so as to form a flat layer, an auxiliary spacer, and a main spacer includes the sub-steps of:
   exposing the insulation layer once through the photomask; and developing the insulation layer, so as to form the flat layer, the auxiliary spacer, and the main spacer simultaneously.

Other features and advantages of the present disclosure will be further explained in the following description, and partly become self-evident therefrom, or be understood through implementation of the present disclosure. The objectives and advantages of the present disclosure will be achieved through the structure specifically pointed out in the description, claims, and the accompanying drawings.

BRIEF DESCRIPTION OF THE DRAWINGS

In order to explicitly illustrate the technical solution in the embodiments of the present disclosure, accompanying drawings that will be referred to in illustrating the embodiments will be simply explained, in which.

DETAILED DESCRIPTION OF THE EMBODIMENTS

The present disclosure will be explained in detail with reference to the embodiments and the accompanying drawings, whereby it can be fully understood how to solve the technical problem by the technical means according to the present disclosure and achieve the technical effects thereof, and thus the technical solution according to the present disclosure can be implemented. It is important to note that as long as there is no structural conflict, all the technical features mentioned in all the embodiments may be combined together in any manner, and the technical solutions obtained in this manner all fall within the scope of the present disclosure.

Figure 1:
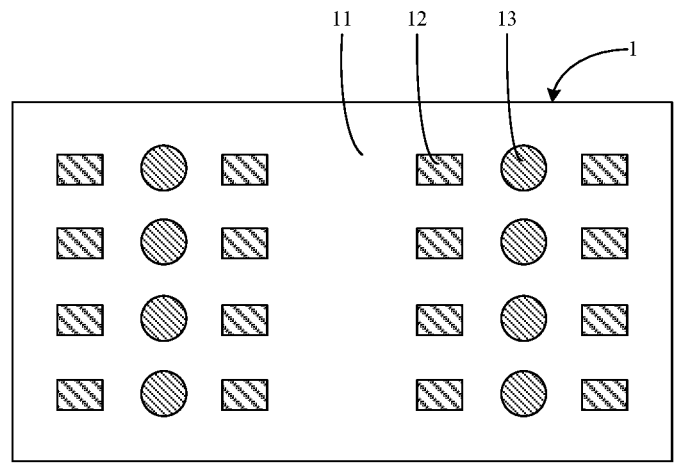
FIG. 1 schematically shows the structure of a photomask provided in an embodiment of the present disclosure.

In an embodiment of the present disclosure, a photomask 1 is provided. As shown in FIG. 1, the photomask 1 comprises a first portion 11 with a first transmittance, a second portion 12 with a second transmittance, and a third portion 13 with a third transmittance. Specifically, the first portion 11, the second portion 12, and the third portion 13 correspond to a flat layer 3 of a color filter substrate, an auxiliary spacer 4 of the color filter substrate, and a main spacer 5 of the color filter substrate, respectively.

Obviously, the flat layer 3, the auxiliary spacer 4, and the main spacer 5 of the color filter substrate can be formed simply with the photomask 1, thereby largely simplifying manufacturing process and lowering manufacturing costs of the color filter substrate.

Figure 2:
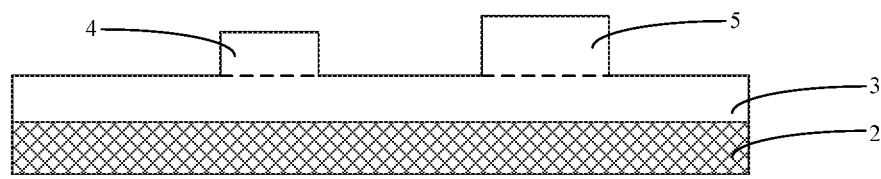
FIG. 2 schematically shows the structure of a color filter substrate manufactured according to the embodiment of the present disclosure.

As depicted in FIG. 2, in connection with the color filter substrate, the flat layer 3 is formed on a substrate structure 2 including a black matrix, a color barrier, etc. The auxiliary spacer 4, and the main spacer 5 having a larger height than the auxiliary spacer 4 are formed on the flat layer 3. Obviously, the flat layer 3, the auxiliary spacer 4, and the main spacer 5 can be formed into one piece.

Since the flat layer 3, the auxiliary spacer 4, and the main spacer 5 are of different heights, the photomask 1 that can be used for simultaneous manufacture of the flat layer 3, the auxiliary spacer 4, and the main spacer 5 should have different transmittance in different portions thereof. Therein, the first transmittance of the first portion 11 for manufacture of the flat layer 3 is larger than the second transmittance of the second portion 12 for manufacture of the auxiliary spacer 4. Since the main spacer 5 is higher than the auxiliary spacer 4, the second transmittance of the second portion 12 for manufacture of the auxiliary spacer 4 is larger than the third transmittance of the third portion 13 for manufacture of the main spacer 5.

The embodiment of the present disclosure does not provide any limitations to the transmittances of the portions of the photomask. The configurations satisfying the requirements that the first transmittance is larger than the second transmittance, and the second transmittance is larger than the third transmittance all fall within the scope of the embodiment of the present disclosure.

Figure 3:
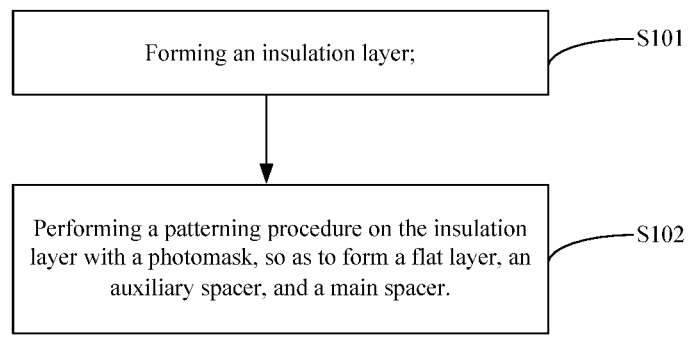
FIG. 3 shows the flow chart of a method of manufacturing the color filter substrate provided in the embodiment of the present disclosure.

The embodiment of the present disclosure further provides a method of manufacturing a color filter substrate with the photomask 1 as explained above. As shown in FIG. 3, the method comprises the following steps.

In step S101, an insulation layer 6 is formed.

Figure 4:
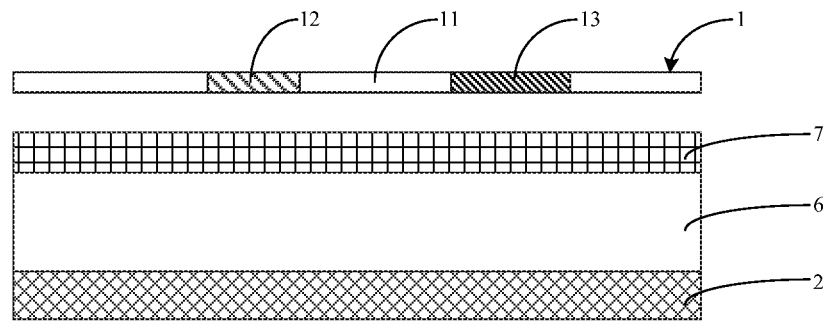
FIGS. 4-6 schematically show manufacturing process of the color filter substrate provided in the embodiment of the present disclosure.

As shown in FIG. 4, after the substrate structure 2 including the black matrix, the color barrier, and the like are formed, the insulation layer 6 is formed by coating or other means. The insulation layer 6 can be made of transparent and insulating organic material, for example, one or more selected from the group consisting of NOx, SiOx, and SiNx. Alternatively, the insulation layer 6 can be made of equally insulating and transparent photoresist.

In step S102, a patterning procedure is performed on the insulation layer with the photomask, so as to form the flat layer, the auxiliary spacer, and the main spacer.

The patterning procedure performed on the insulation layer 6 made of one or more selected from the group consisting NOx, SiOx, and SiNx at least comprises the following sub-steps.

A photoresist layer 7 is first formed on the insulation layer 6 by coating or other means. The photoresist is a light-sensitive liquid mixture mainly composed of three components, i.e., photosensitive resin, sensitizer (see spectral sensitizing dyes), and a solution.

Since the photoresist is a liquid mixture, it is necessary to be prebaked and cured after being coated, so as to transform the photoresist from liquid to solid, and form the photoresist layer 7 required in the embodiment of the present disclosure.

Subsequently, as indicated in FIG. 4, the photoresist layer 7 is exposed through the photomask 1. Ultraviolet light with a wave length in the range from 200 to 450 nm can be used for exposure, the duration of which, determined by the thickness and type of the photoresist, can be controlled in the range from 20 to 180 s.

When the photoresist is first exposed, a portion of the photoresist layer 7 corresponding to the first portion 11 of the photomask 1 should be sufficiently exposed, followed by development of the exposed photoresist layer 7. The portion of the photoresist layer 7 corresponding to the first portion 11 of the photomask 1, because of being sufficiently exposed, will be completely removed after being developed. As the second transmittance of the second portion 12 of the photomask 1 is smaller than the first transmittance of the first portion 11, a portion of the photoresist layer 7 corresponding to the second portion 12 will be exposed in a surface part thereof. Thus, after being developed, the portion of the photoresist layer 7 corresponding to the second portion 12 will be partially removed. The third transmittance of the third portion 13, being the smallest among the three, approximates zero (almost completely opaque). Therefore, a portion of the photoresist layer 7 corresponding to the third portion 13 will hardly be exposed to light, and thereby substantially remains after being developed.

Figure 5:
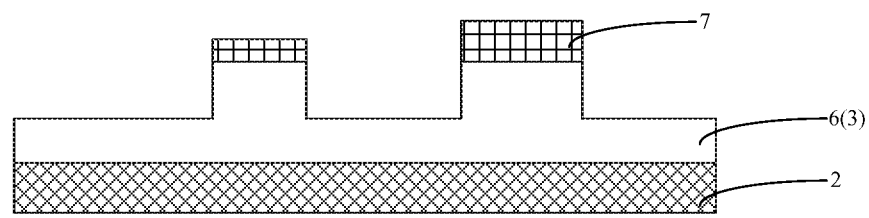

After being developed, the portion of the photoresist layer 7 corresponding to the first portion 11 of the photomask 1 will be completely removed, and a portion of the insulation layer 6 corresponding to such a portion of the photoresist layer 7 will thus be exposed. Therefore, a corresponding etching solution can be used to etch the insulation layer 6 for a first time, so as to form the flat layer 3, as illustrated in FIG. 5.

Subsequently, the photoresist layer 7 will be exposed and developed for a second time. As a pattern of the photomask 1 is completely transferred onto the photoresist layer 7 upon the first exposure, the photomask 1 will be unnecessary to be used during the second exposure. Instead, ultraviolet light can be directly used to illuminate the color filter substrate entirely. The portion of the photoresist layer 7 corresponding to the second portion 12 of the photomask 1 will be completely exposed during the second exposure, while the portion of the photoresist layer 7 corresponding to the third portion 13, due to its greater thickness, will be exposed in a surface part thereof only. As a result, after being developed, the portion of the photoresist layer 7 corresponding to the second portion 12 of the photomask 1 will be completely removed, while the portion of the photoresist layer 7 corresponding to the third portion 13 will be partially removed.

Figure 6:
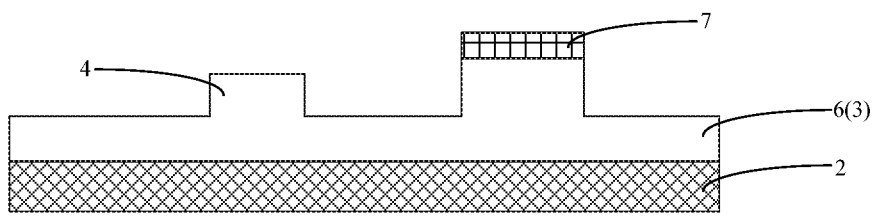

Since the portion of the photoresist layer 7 corresponding to the second portion 12 of the photomask 1 is completely removed upon the second exposure and development, a portion of the insulation layer 6 corresponding to the second portion 12 will be exposed. The insulation layer 6 can thus be etched for a second time, so as to form the auxiliary spacer 4 which is lower than the main auxiliary spacer 5, as illustrated in FIG. 6.

It should be noted that, while the auxiliary spacer 4 is being formed, the flat layer 3 is also exposed and etched by the etching solution. The thickness of the flat layer 3 will therefore be further decreased. Thus, the flat layer 3 can retain an extra thickness during formation thereof while the insulation layer 6 is being etched for the first time. The retained extra thickness of the flat layer 3 can be removed while the auxiliary spacer 4 is being formed.

Finally, the main spacer 5 having a largest height can be formed as long as the portion of the photoresist layer 7 corresponding to the third portion 13 is removed. This is shown in FIG. 2.

After the main spacer 5 is formed, where the thickness of the flat layer 3, the height of the auxiliary spacer 4, or the height of the main spacer 5 is larger than a designed value, the color filter substrate, as a whole, can be further etched, to appropriately reduce the thickness of the flat layer 3, or the height of the auxiliary spacer 4 or the main spacer 5.

In case the insulation layer 6 is formed by photoresist, the patterning procedure for formation of the flat layer 3, the auxiliary spacer 4, and the main spacer 5 by means of the insulation layer 6 will be simpler. It is only necessary to expose the insulation layer 6 once, through the photomask 1, wherein the irradiation duration of ultraviolet light is controlled in such a manner that the portion of the insulation layer 6 corresponding to the first portion 11 of the photomask 1, the portion of the insulation layer 6 corresponding to the second portion 12, and the portion of the insulation layer 6 corresponding to the third portion 13 are exposed in successively reduced degrees. Subsequently, after the insulation layer 6 is developed, the flat layer 3, the auxiliary spacer 4, and the main spacer 5 can be simultaneously formed as per degrees at which respective portions of the insulation layer 6 are exposed.

In the color filter substrate finally formed, the thickness of the flat layer 3 can be in the range from 1 to 5 μm; the height of the main spacer 5 can be in the range from 1 to 4 μm; and the height of the auxiliary spacer 4 is smaller than that of the main spacer 5.

The above embodiments are described only for better understanding, rather than restricting, the present disclosure. Any person skilled in the art can make amendments to the implementing forms or details without departing from the spirit and scope of the present disclosure. The scope of the present disclosure should still be subject to the scope defined in the claims.

The invention claimed is:

1. A method of manufacturing a color filter substrate, comprising the steps of:
   forming an insulation layer; and
   performing a patterning procedure on the insulation layer with a photomask, so as to form a flat layer, an auxiliary spacer, and a main spacer, wherein the photomask comprises a first portion with a first transmittance, a second portion with a second transmittance, and a third portion with a third transmittance,
   wherein the first portion, the second portion, and the third portion correspond to a flat layer of the color filter substrate, an auxiliary spacer of the color filter substrate, and a main spacer of the color filter substrate, respectively; and
   wherein the step of performing a patterning procedure on the insulation layer with a photomask, so as to form a flat layer, an auxiliary spacer, and a main spacer includes the sub-steps of:
   forming a photoresist layer on the insulation layer;
   exposing the photoresist layer through the photomask;
   developing the exposed photoresist layer, such that portions of the photoresist layer corresponding to the first portion, the second portion, and the third portion of the photomask are completely removed, partially removed, and completely retained, respectively;
   etching the insulation layer for a first time, so as to form the flat layer;
   exposing and developing the photoresist layer for a second time, such that the portion of the photoresist layer corresponding to the second portion and the third portion of the photomask are completely and partially removed, respectively;
   etching the insulation layer for a second time, so as to form the auxiliary spacer; and
   removing the portion of the photoresist layer corresponding to the third portion completely, so as to form the main spacer.

2. The method according to claim 1, wherein the first transmittance is larger than the second transmittance, and the second transmittance is larger than the third transmittance.

3. The method according to claim 2, wherein the flat layer has a thickness in the range from 1 to 5 μm, and the main spacer has a height in the range from 1 to 4 μm.

4. The method according to claim 3, wherein the auxiliary spacer has a height smaller than the height of the main spacer.

5. The method according to claim 4, wherein the insulation layer is made of one or more materials selected from a group consisting of nitrogen oxides, silicon oxides, and nitrogen silicides.

* * * * *